(12) United States Patent
Ushiyama et al.

(10) Patent No.: US 7,401,308 B2
(45) Date of Patent: Jul. 15, 2008

(54) TIMING ANALYSIS APPARATUS, TIMING ANALYSIS METHOD, AND COMPUTER PRODUCT

(75) Inventors: Kenichi Ushiyama, Kawasaki (JP); Hisayoshi Oba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 327 days.

(21) Appl. No.: 11/106,697

(22) Filed: Apr. 15, 2005

(65) Prior Publication Data

US 2006/0064659 A1  Mar. 23, 2006

(30) Foreign Application Priority Data

Sep. 17, 2004  (JP) .............................. 2004-272381

(51) Int. Cl.
*G06F 17/50* (2006.01)
*G06F 9/45* (2006.01)
(52) U.S. Cl. .................................. 716/6; 716/8; 716/12
(58) Field of Classification Search ...................... 716/6, 716/8, 12
See application file for complete search history.

(56) References Cited

U.S. PATENT DOCUMENTS

| | | | |
|---|---|---|---|
| 6,654,938 B2 | 11/2003 | Kosugi | |
| 6,687,890 B2 | 2/2004 | Sato | |
| 7,181,717 B1* | 2/2007 | Singh et al. | 716/16 |
| 2004/0054979 A1* | 3/2004 | Bobba et al. | 716/13 |
| 2004/0060022 A1* | 3/2004 | Allen et al. | 716/6 |
| 2006/0048085 A1* | 3/2006 | Tyler et al. | 716/6 |
| 2006/0059446 A1* | 3/2006 | Chen et al. | 716/6 |

FOREIGN PATENT DOCUMENTS

| | | |
|---|---|---|
| JP | 2002-215710 | 8/2002 |
| JP | 2002-312410 | 10/2002 |

* cited by examiner

*Primary Examiner*—Jack Chiang
*Assistant Examiner*—Magid Y Dimyan
(74) *Attorney, Agent, or Firm*—Staas & Halsey LLP (57) ABSTRACT

A timing analysis apparatus includes a data extracting unit that extracts objective circuit data concerning an objective circuit to become an objective of a timing analysis from layout data indicating circuits on a large-scale-integration chip; a time calculating unit that calculates a delay time of the objective circuit based on the objective circuit data; a parameter calculating unit that calculates a parameter indicating a size of an arrangement area of the objective circuit based on the objective circuit data; an information calculating unit that calculates variation information concerning a variation of the delay time; and a timing analyzing unit that performs the timing analysis of the objective circuit using the delay time and the variation information.

22 Claims, 8 Drawing Sheets

PRIOR ART

| DISTRIBUTION AREA | POWER SOURCE VOLTAGE DECLINE RATIO (%) |
|---|---|
| A1 | 0 ~ 0.1 |
| A2 | 0.1 ~ 0.2 |
| A3 | 0.2 ~ 0.3 |
| ⋮ | |
| An | M ~ N |

FIG.11

TIMING ANALYSIS APPARATUS, TIMING ANALYSIS METHOD, AND COMPUTER PRODUCT

CROSS-REFERENCE TO RELATED APPLICATIONS

This application is based upon and claims the benefit of priority from the prior Japanese Patent Application No. 2004-272381, filed on Sep. 17, 2004, the entire contents of which are incorporated herein by reference.

BACKGROUND OF THE INVENTION

1) Field of the Invention

The present invention relates to a timing analysis apparatus, a timing analysis method, a timing analysis program, and a recording medium for static timing analysis of circuits arranged and wired on a large-scale integration (LSI) chip.

2) Description of the Related Art

In the conventional technology, in static timing analysis (STA) of a LSI, on chip variation (OCV) of delay time (or delay) in a LSI chip arising from temperature, voltage, and manufacturing process is used.

In concrete, a variation on this LSI chip is quantified, and is used as a variation value. For example, by multiplying delay time of a path to input to a sync flip-flop (FF), a path to input to a source FF, and a path between both the FFs by a variation value, timing analysis is carried out. It is necessary to make this variation value a value in which all the variations of supposed delay time are taken into consideration. Among them, with regard to manufacturing process variations, a distance between circuit elements that cause a variation value is set with a supposed maximum range as a reference. Meanwhile, with regard to voltage variations, a potential difference owing to a power source decline is set as a variation value. Furthermore, with regard to temperature variations, a temperature difference between circuits is set as a variation value.

Figure 1:
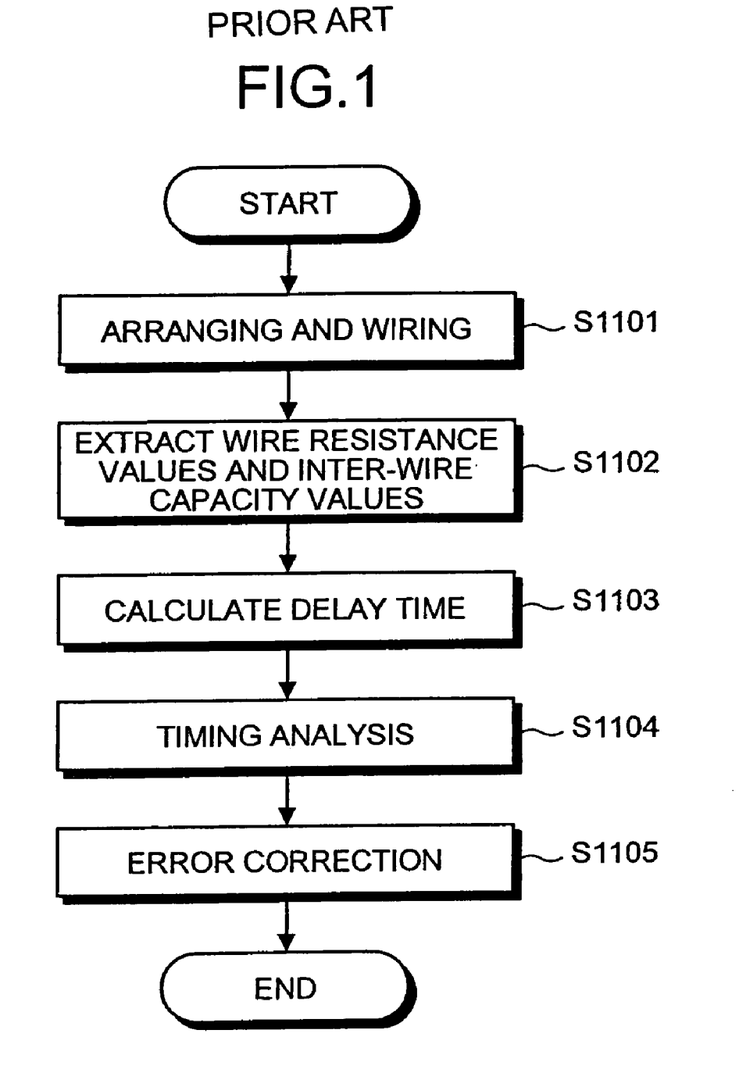
FIG. 1 is a flowchart showing a timing analysis method according to a conventional technology.

A timing analysis method according to the conventional technology is explained. FIG. 1 is a flowchart showing a timing analysis method according to the conventional technology. Macro cells and logic circuits are arranged and wired on a LSI chip (step S1101). From layout data obtained from this arrangement and wiring, wire resistance values and inter-wire capacity values are extracted (step S1102). Then, by use of the layout data, wire resistance values, and inter-wire capacity values, a delay time is calculated (step S1103). By use of this calculated delay time and the variation values mentioned above, timing analysis is carried out (step S1104). Finally, an error obtained by the result of timing analysis is corrected (step S1105).

In fully custom LSI designs, a delay characteristic analysis method is disclosed where prompt and precise delay characteristic analysis is enabled, when conditions concerning circuit designs and signal transmissions are changed partially, by making the most of analysis results on circuits before the change (see, for example, Patent Application Laid-Open Publication No. 2002-215710). Furthermore, a method to attain both a shortened development period and a low electricity consumption that are in relations of a trade-off is disclosed (see, for example, Patent Application Laid-Open Publication No. 2002-312410).

However, in the methods according to the conventional technology, variation values used in timing analysis are values in which all the variations of supposed delay time, i.e., variations of voltage, temperature, and manufacturing process, should be taken into consideration, therefore, the values are used as constant ones to any of circuits.

Accordingly, when the range of a circuit that causes variation values is narrow (for example, the distance between a sync FF and a source FF is short), variations of manufacturing process and voltage become excessive, and as a result a useless margin occurs. The useless margin makes it difficult to converge the timing, and also increase the size of LSI chips, which has been a problem with the conventional technology.

SUMMARY OF THE INVENTION

It is an object of the present invention to solve at least the above problems in the conventional technology.

A timing analysis apparatus according to one aspect of the present invention includes a data extracting unit that extracts objective circuit data concerning an objective circuit to become an objective of a timing analysis from layout data indicating circuits arranged and wired on a large-scale-integration chip; a time calculating unit that calculates a delay time of the objective circuit based on the objective circuit data extracted; a parameter calculating unit that calculates a parameter indicating a size of an arrangement area of the objective circuit based on the objective circuit data extracted; an information calculating unit that calculates variation information concerning a variation of the delay time calculated; and a timing analyzing unit that performs the timing analysis of the objective circuit using the delay time and the variation information calculated.

A timing analysis apparatus according to another aspect of the present invention includes a data extracting unit that extracts objective circuit data concerning an objective circuit to become an objective of a timing analysis from layout data indicating circuits arranged and wired on a large-scale-integration chip; a time calculating unit that calculates a delay time of the objective circuit based on the objective circuit data extracted; a timing analyzing unit that performs the timing analysis of the objective circuit using the delay time calculated; a parameter calculating unit that calculates a parameter indicating a size of an arrangement area of the objective circuit that is determined to have a timing error as a result of the timing analysis; and an information calculating unit that calculates variation information concerning a variation of the delay time calculated. The timing analyzing unit performs the timing analysis of the objective circuit that is determined to have the timing error based on the delay time and the variation information calculated.

A timing analysis method according to still another aspect of the present invention includes extracting objective circuit data concerning an objective circuit to become an objective of a timing analysis from layout data indicating circuits arranged and wired on a large-scale-integration chip; calculating a delay time of the objective circuit based on the objective circuit data extracted; calculating a parameter indicating a size of an arrangement area of the objective circuit based on the objective circuit data extracted; calculating variation information concerning a variation of the delay time calculated; and performing the timing analysis of the objective circuit using the delay time and the variation information calculated.

A timing analysis method according to still another aspect of the present invention includes extracting objective circuit data concerning an objective circuit to become an objective of a timing analysis from layout data indicating circuits arranged and wired on a large-scale-integration chip; calculating a delay time of the objective circuit based on the objective circuit data extracted; performing the timing analysis of the objective circuit using the delay time calculated; calculating a parameter indicating a size of an arrangement area of the objective circuit that is determined to have a timing error as a result of the timing analysis; and calculating variation information concerning a variation of the delay time calculated. The performing includes performing the timing analysis of the objective circuit that is determined to have the timing error based on the delay time and the variation information calculated.

A timing analysis program according to still another aspect of the present invention causes a computer to execute the above timing analysis methods according to the present invention.

A computer-readable recording medium according to still another aspect of the present invention stores a timing analysis program that causes a computer to execute the above timing analysis methods according to the present invention.

The other objects, features, and advantages of the present invention are specifically set forth in or will become apparent from the following detailed description of the invention when read in conjunction with the accompanying drawings.

DETAILED DESCRIPTION

Exemplary embodiments of a timing analysis apparatus, a timing analysis method, and a computer product according to the present invention are explained in detail with reference to the accompanying drawings. The timing analysis apparatus and the timing analysis method according to the embodiments herein may be realized, for example, by a CAD equipped with a recording medium in which a timing analysis program according to the embodiment is recorded.

Figure 2:
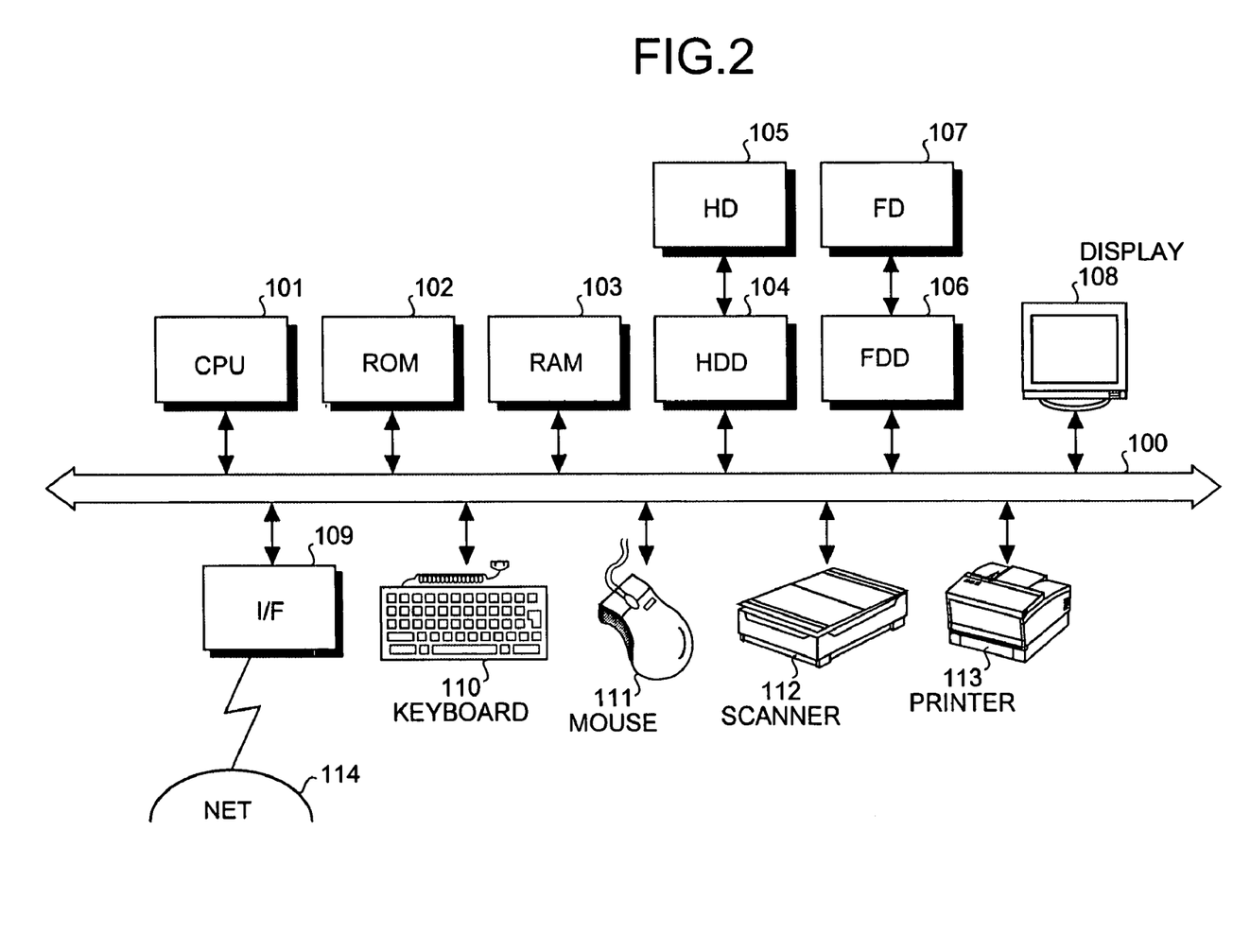
FIG. 2 is a block diagram showing a hardware configuration of a timing analysis apparatus according to an embodiment of the present invention.

FIG. 2 is a block diagram showing a hardware configuration a timing analysis apparatus according to an embodiment of the present invention.

In the structure shown in FIG. 2, a timing analysis apparatus includes a CPU 101, a ROM 102, a RAM 103, a hard disk drive (HDD) 104, a hard disk (HD) 105, a flexible disk drive (FDD) 106, a flexible disk (FD) 107 as an example of a detachable recording medium, a display 108, an interface (I/F) 109, a keyboard 110, a mouse 111, a scanner 112, and a printer 113. Furthermore, the respective components are connected via a bus 100.

Herein, the CPU 101 takes the entire control of the timing analysis apparatus. The ROM 102 memorizes programs such as a boot program. The RAM 103 is used as the work area of the CPU 101. The HDD 104 controls read/write of data to the HD 105 according to the control of the CPU 101. The HD 105 memorizes data written by the control of the HDD 104.

The FDD 106 controls read/write of data to the FD 107 according to the control of the CPU 101. The FD 107 memorizes data written by the control of the FDD 106, and makes the timing analysis apparatus read data memorized in the FD 107.

Furthermore, as a detachable recording medium, besides the FD 107, a CD-ROM (CD-R, CD-RW), a MO, a digital versatile disk (DVD), a memory card may be employed. The display 108 displays a cursor, icons or tool boxes, and further data of documents, images, function information items, and the likes. As this display 108, for example, a CRT, a TFT liquid crystal display, a plasma display, and the like may be employed.

The I/F 109 is connected to a network 114 such as internet via a communication line, and connected to other components via this network 114. Thereby, the I/F 109 controls interfaces between the network 114 and the device inside, and controls data input and output from and to external devices. As the I/F 109, for example a modem, a LAN adaptor or the like may be employed.

The keyboard 110 has keys for inputting characters, numeric values, various instructions, and the likes, and thereby inputs data. Meanwhile, a touch panel type input pad or ten keys may be also employed. The mouse 111 moves the cursor, selects screen areas, and moves windows, and changes the sizes thereof. Instead of the pointing device, a track ball, a joy stick or the like may be employed.

The scanner 112 reads images optically, and takes image data into the timing analysis apparatus. By the way, the scanner 112 may be equipped with an OCR function. Furthermore, the printer 113 prints out image data and document data. As the printer 113, for example, a laser printer or an ink jet printer may be employed.

Figure 3:
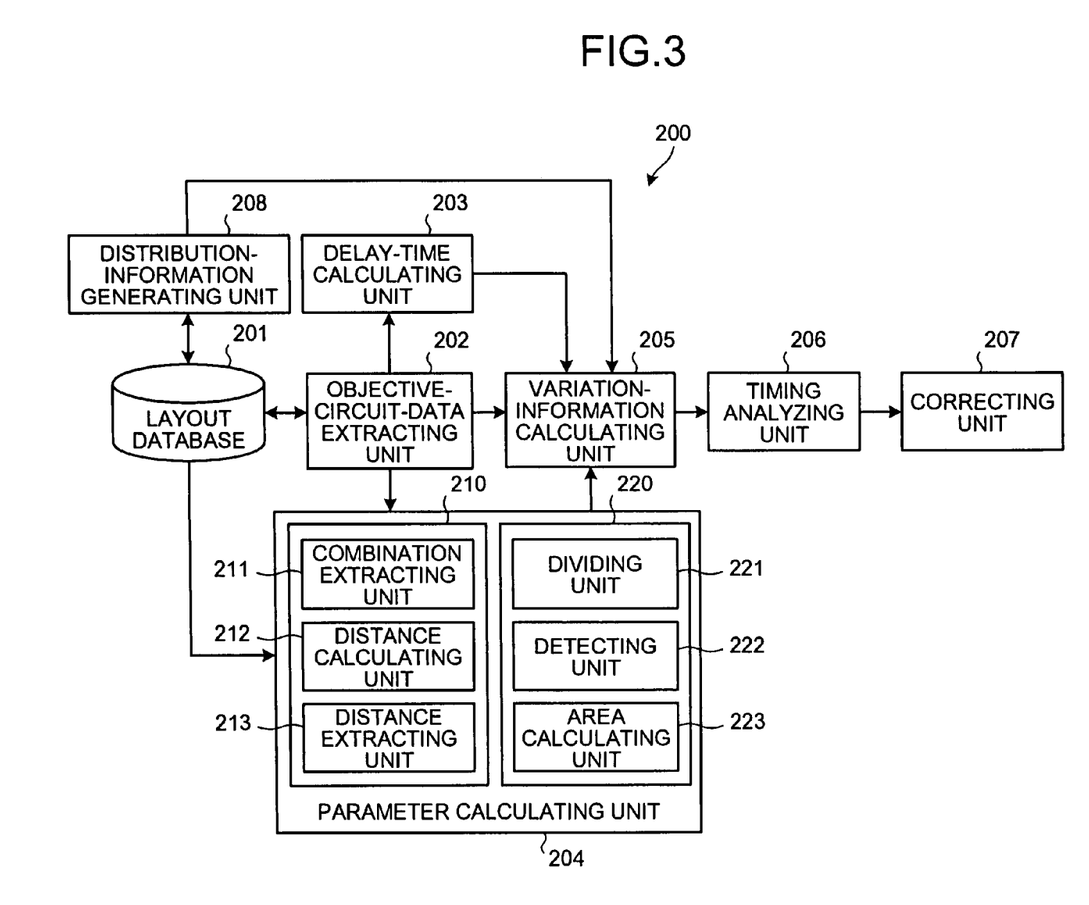
FIG. 3 is a block diagram showing a functional configuration of the timing analysis apparatus.

FIG. 3 is a block diagram showing a functional configuration of a timing analysis apparatus according to an embodiment of the present invention. In the structure shown in FIG. 3, a timing analysis apparatus 200 has a layout database 201, an objective circuit data extracting unit 202, a delay time calculating unit 203, a parameter calculating unit 204, a variation information calculating unit 205, a timing analyzing unit 206, a correcting unit 207, and a distribution information generating unit 208.

Figure 4:
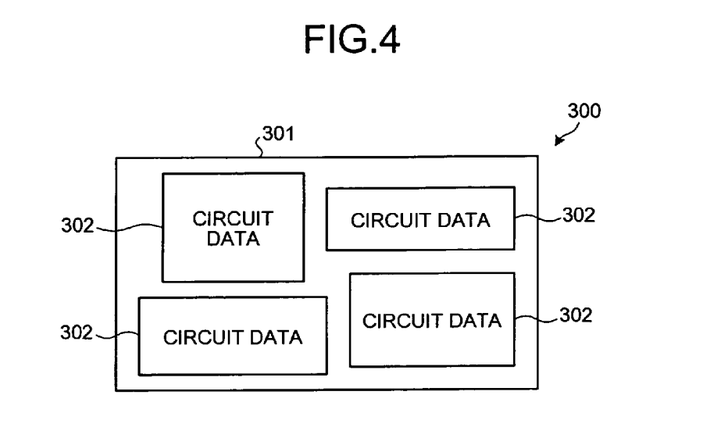
FIG. 4 is an explanatory figure showing layout data memorized in a layout database.

The layout database 201 memorizes layout data concerning circuits that are arranged and wired on a LSI chip. Herein, layout data memorized in the layout data base 201 is explained. FIG. 4 is an explanatory figure showing layout data memorized in the layout database 201.

In the structure shown in FIG. 4, layout data 300 has chip data 301 showing a LSI chip, and circuit data 302 showing circuits to be arranged on the LSI chip. Herein, circuits in concrete include macro cells having specified functions, and circuit blocks where the macro cells and plural circuit elements are arranged and wired. As macro cells, for example, there are a RAM macro that memorizes data, a calculation macro that executes calculations of addition, multiplication, and the likes, a phase locked loop (PLL), and so forth. Meanwhile, as circuit elements, there are, for example, logic circuits such as a logic gate circuit, a combination logic circuit, a sequence logic circuit, and the likes.

The chip data 301 and the circuit data 302 are stored in a library not illustrated therein, and a user by use of a specified layout tool, may extract the chip data 301 and the circuit data 302 from the library and generate the layout data 300. The circuit data 302 mentioned above is structured by circuit element data. The circuit data 302 and the circuit element data respectively have driving performance values, resistance values, electricity consumption values, and the likes.

Meanwhile, though not illustrated therein, circuit element data is arranged among the respective circuit data 302, so that the LSI can execute desired functions. The circuit element data, according to a net list not illustrated therein, is arranged and wired so as to connect the respective circuit data 302. By the way, this layout database 201, in concrete, realizes the functions thereof, by recording media such as the ROM 102, the RAM 103, the HD 105, and the FD 107 in shown FIG. 2.

In the structure shown in FIG. 3, the objective circuit data extracting unit 202 extracts objective circuit data concerning an arbitrary circuit to become an analysis objective (hereinafter, "objective circuit"), from the layout data 300. Herein, the objective circuit is a circuit comprising plural circuit elements, and objective circuit data is the circuit data 302 of the objective circuit, i.e., a set of plural circuit element data laid out.

Figure 5:
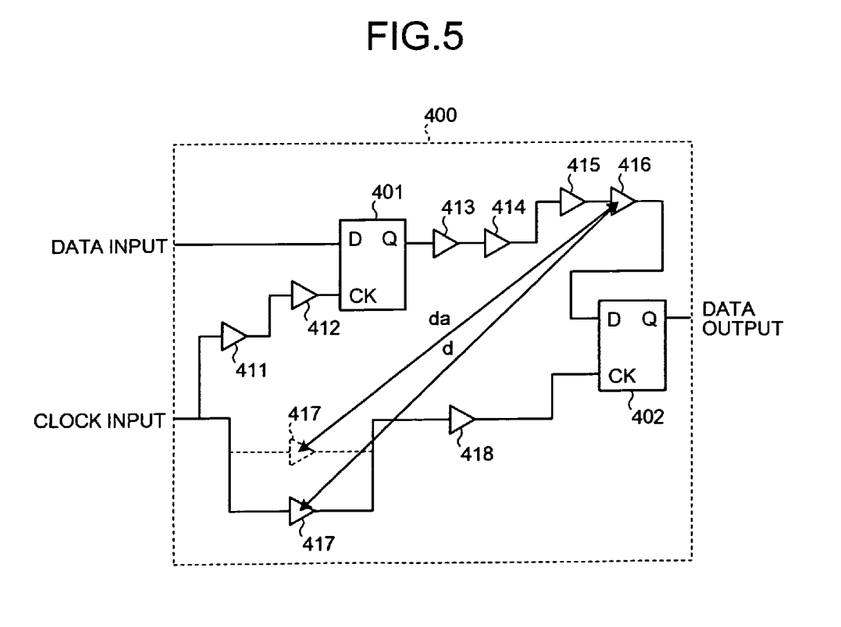
FIG. 5 is a block diagram showing an example of objective circuit data.

FIG. 5 is a block diagram showing an example of objective circuit data. In the structure shown in FIG. 5, an objective circuit data 400 is one of the circuit data 302 shown in FIG. 4. The objective circuit data 400 includes a sync FF 401 as circuit element data, a source FF 402, and plural buffers 411 to 418 arranged and wired therein.

Meanwhile, in the structure shown in FIG. 3, the delay time calculating unit 203 calculates a delay time D1 of the objective circuit, on the basis of the objective circuit data 400 extracted by the objective circuit data extracting unit 202. Calculation of a delay time is already known to those skilled in the art, and generally, for example, wire resistance values and inter-wire capacity values of wire data that connects the circuit element data that configure the objective circuit data 400 are extracted. Then, by use of the extracted wire resistance values and inter-wire capacity values, a delay time D1 may be calculated. Herein, the delay time D1 is, for example, in the structure shown in FIG. 5, the sync FF 401 (or the source FF 402) into which data signals and clock signals are input, and is expressed by a time difference between the input timing of data signals and that of clock signals.

Furthermore, the parameter calculating unit 204 calculates parameters showing the size of the arrangement area of an objective circuit, on the basis of the objective circuit data 400 extracted by the objective circuit data extracting unit 202. This parameter calculating unit 204, in concrete, has a distance calculation processing unit 210 and an area calculation processing unit 220. The area calculation processing unit 220 is described later herein.

The distance calculation processing unit 210 calculates a distance between two arbitrary circuit element data pieces that configure the objective circuit data 400. Herein, as the two arbitrary circuit element data pieces whose distance is calculated, for example, circuit element data of circuit elements on a transmission route inserted for adjusting timing, such as buffers, may be employed.

The distance calculation processing unit 210, in concrete, includes a combination extracting unit 211, a distance calculating unit 212, and a distance extracting unit 213. The combination extracting unit 211 extracts a combination of two arbitrary circuit element data pieces from the circuit element data pieces that configure the objective circuit data 400. In concrete, in the structure shown in FIG. 5, the combination extracting unit extracts a combination of two arbitrary buffers, among the buffers 411 to 418. In the structure shown in FIG. 5, since eight units of the buffers 411 to 418 are inserted, 28 combinations may be extracted.

Furthermore, the distance calculating unit 212 calculates the distance between the two circuit element data pieces concerning the combinations extracted by the combination extracting unit 211. For example, in FIG. 5, the distance calculating unit calculates the distance of the buffers concerning the twenty-eight combinations. This distance is not a wire length between two buffers, but a straight line distance. This distance may be calculated by use of coordinate positions of two buffers.

The distance extracting unit 213 extracts the maximum distance d from distances calculated by the distance calculating unit 212. The reason for using this maximum distance d is because the variation of delay time caused by manufacturing processes takes the maximum distance d between the buffers that give this variation as a reference. In the structure shown in FIG. 5, the combination of buffers that make the distance maximum is that of the buffer 416 and the buffer 417.

The variation information calculating unit 205 calculates variation information concerning the variation of the delay time calculated by the delay time calculating unit 203, on the basis of the distance d calculated by the distance calculating unit 212. In concrete, for example, by use of following equation (1), variation information V(d) may be calculated.

$$V(d) = ocv \times \alpha(d) \quad (1)$$

where V(d) is variation information, d is the distance calculated by the distance calculating unit 212, ocv is an on chip variation (OCV) coefficient that has been employed so far in the art, $\alpha(d)$ is a fluctuation function that fluctuates ocv, and is a function with which it stands that $0 < \alpha(d) \leq 1$. With regard to $\alpha(d)$, when the distance d is the maximum value (d=max(d)), it stands that $\alpha(d)=1$.

Meanwhile, the timing analyzing unit 206 carries out timing analysis of the objective circuit, by use of the delay time D1 and the variation information V(d). This timing analyzing unit 206, having a function similar to that in the conventional technology, analyzes whether the delay time D2 obtained by multiplying the delay time D1 by the variation information V(d) satisfies a delay time D0 to become a threshold value.

In concrete, in the source FF 402 shown in FIG. 5, if data signals should be input with delay×[psec] after clock signals, this×[psec] becomes the delay time D0. In this instance, if the delay time D2 is shorter than the delay time D0, a timing error occurs.

The correcting unit 207 corrects the arrangement of circuit element data that configure the objective circuit data 400. In concrete, when a timing error is detected by the timing analyzing unit 206, the parameter calculating unit 204, by use of the information concerning the timing error concerned and the delay time D1, calculates new parameters that enable to eliminate the timing error. Then, the correcting unit 207, by use of the newly calculated parameters, corrects the arrangement of the circuit element data that configure the objective circuit data 400. Herein, the information concerning the timing error is, for example, the delay time D0 to become a threshold value.

Furthermore, in the example, if the delay time D2 is shorter than the delay time D0, the input timing of data signals is earlier, therefore a timing error occurs. Accordingly, a distance d to satisfy following equation (2) is calculated.

$$D0 = D1 \times V(d) \tag{2}$$

When the distance that satisfies the timing by this equation (2) is defined as da, by use of the distance da, the arrangement of the two circuit element data pieces that have become the calculation objectives of the distance d is changed. For example, in the structure shown in FIG. 5, in the distance d between the buffer 416 and the buffer 417 calculated by the distance calculating unit 212, the arrangement position of the buffer 417 is changed to the position shown by a center line in FIG. 5, so that the distance between the buffer 416 and the buffer 417 should become da.

Figure 6:
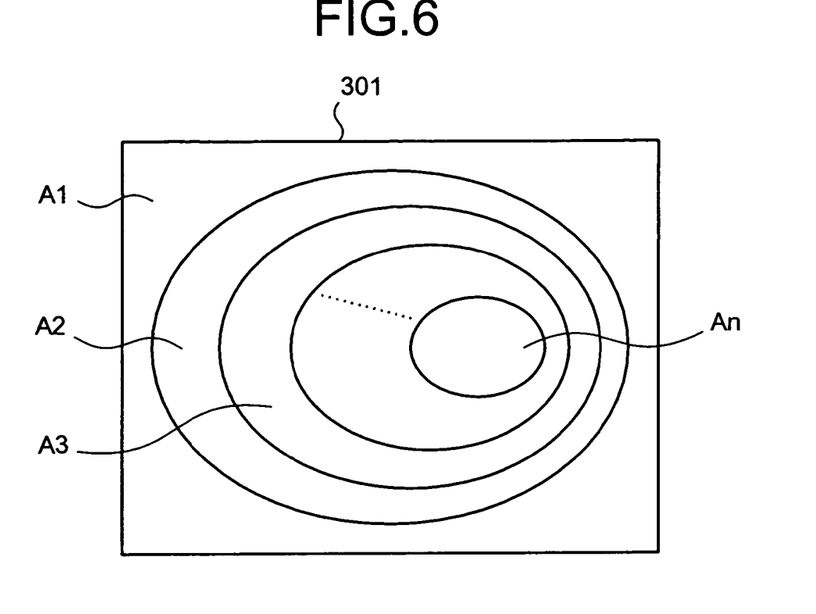
FIG. 6 is an explanatory figure showing an example of power-source-voltage drop ratio distribution information.

Furthermore, the distribution information generating unit 208 generates various distribution information pieces on a LSI chip, on the basis of the layout data 300. As the distribution information, there are, for example, power-source-voltage drop ratio distribution information and electricity consumption distribution information. With regard to the power-source-voltage drop ratio distribution information, in concrete, a power wire net to supply power source voltage to circuits to be arranged is arranged on a LSI chip. Therefore, by use of the wire length of the power wire net and the wire resistance value thereof, the arrangement position of the circuit data 302 on the chip data 301, and the electricity consumption value of the arranged circuit data 302, the power-source-voltage drop ratio is calculated. The area of the chip data 301 is divided per the power-source-voltage drop ratio in a specified range, and the power-source-voltage drop ratio distribution information is generated. FIG. 6 is an explanatory figure showing an example of the power-source-voltage drop ratio distribution information.

In the structure shown in FIG. 6, the chip data 301 is divided into plural distribution areas. In these distribution areas, the voltage decline ratio becomes larger toward the center of the chip data 301. This is because electricity consumption of circuits is added toward the center of a LSI chip, and the wire length of the power wire net becomes longer and the wire resistance value becomes larger.

Figure 7:
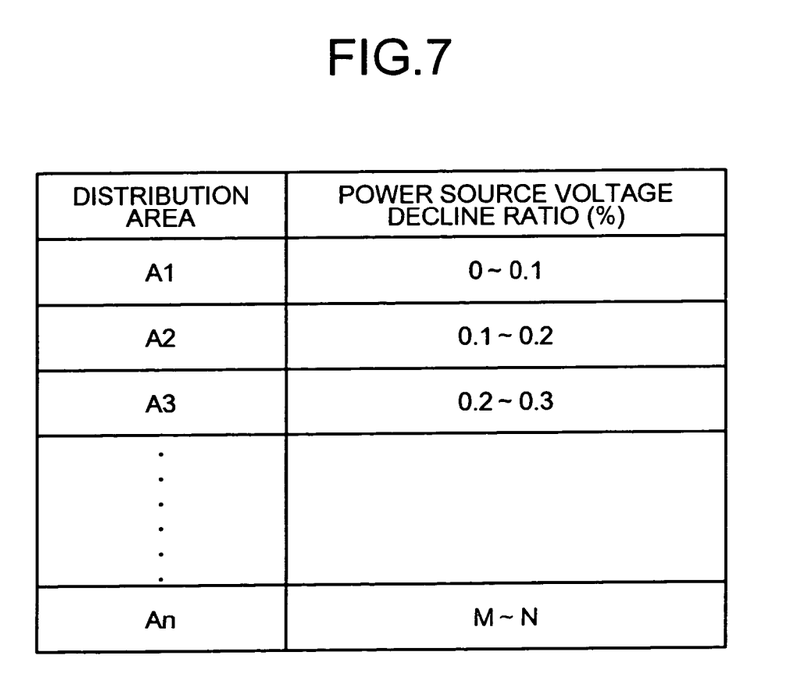
FIG. 7 is a table showing a power-source-voltage drop ratio per each of the distribution areas shown in FIG. 6.

FIG. 7 is a table showing the power-source-voltage drop ratio per each of the distribution areas shown in FIG. 6. In the structure shown in FIG. 7, the distribution area A1 of FIG. 6 shows the power-source-voltage drop ratio distribution of equal to or more than 0% and less than 0.1%. The distribution area A2 shows the power-source-voltage drop ratio distribution of equal to or more than 0.1% and less than 0.2%. The distribution area A3 shows the power-source-voltage drop ratio distribution of equal to or more than 0.2% and less than 0.3%. The distribution area An shows the power-source-voltage drop ratio distribution of equal to or more than M% and less than N%. Such power-source-voltage drop ratio distribution information give influences upon the variation of the delay time, therefore may be employed in timing analysis.

In the variation information calculating unit 205, from this power-source-voltage drop ratio distribution information, the power-source-voltage drop ratio at the arrangement position of the objective circuit data 400 is extracted. When the extracted power-source-voltage drop ratio is defined as e, variation information may be calculated by following equation (3).

$$V(d) = ocv \times \alpha(d) \times \beta(e) \tag{3}$$

Herein, $\beta(e)$ is a fluctuation function that fluctuates ocv in dependence on the power-source-voltage drop ratio e, and is a function with which it stands that $0 < \beta(e) \leq 1$. With regard to $\beta(e)$, when the power-source-voltage drop ratio e is the maximum value (e=max(e)), it stands that $\beta(e)=1$.

Figure 8:
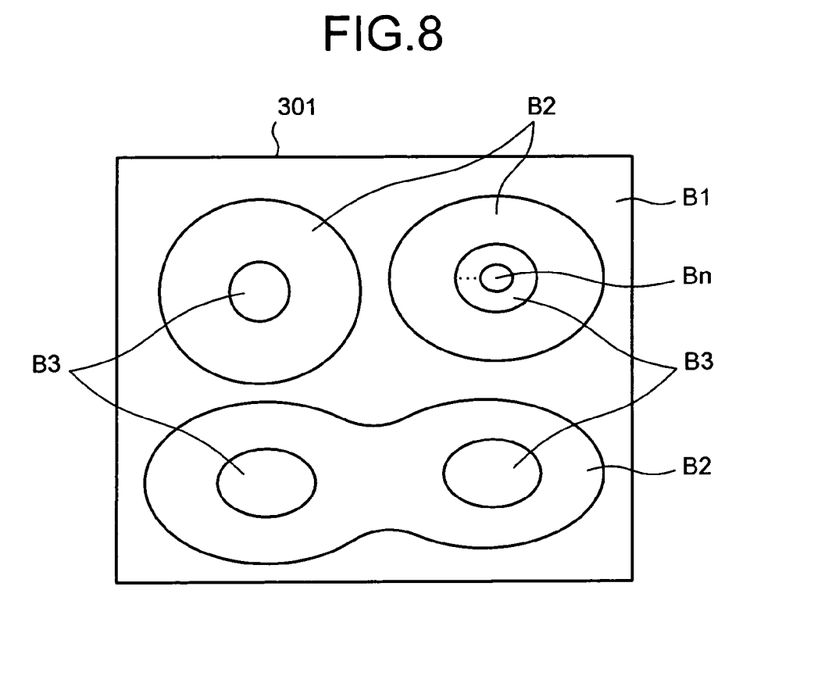
FIG. 8 is an explanatory figure showing an example of electricity consumption distribution information.

Meanwhile, the electricity consumption distribution information may be generated in the same manners as the power-source-voltage drop ratio distribution information. In concrete, by use of the arrangement position of the circuit data 302 on the chip data 301, and the electricity consumption value of the arranged circuit data 302, electricity consumption distribution information is generated. FIG. 8 is an explanatory figure showing an example of electricity consumption distribution information. In the structure shown in FIG. 8, electricity consumption becomes large at the position corresponding to the arrangement position of the circuit data 302 shown in FIG. 4.

In concrete, distribution areas B1 to Bn show the electricity consumption distribution of equal to or more than M% and less than N%. Such power-source-voltage drop ratio distribution information give influences upon the variation of the delay time, therefore may be employed in timing analysis. Electricity consumption is in proportion with a heat generation amount, therefore, electricity consumption substantially represents a temperature distribution, and gives influences upon the variation of the delay time. Accordingly, such electricity consumption distribution information may be employed in timing analysis.

In the variation information calculating unit 205, from this electricity consumption distribution information, the difference between the electricity consumption value at the arrangement position of the objective circuit data 400 and the electricity consumption value to become a reference is calculated. When the calculated electricity consumption difference is defined as f, variation information may be calculated by following equation (4)

$$V(d) = ocv \times \alpha(d) \times \gamma(f) \tag{4}$$

where $\gamma(f)$ is a fluctuation function that fluctuates ocv in dependence on the electricity consumption difference f, and is a function with which it stands that $0 < \gamma(f) \leq 1$. With regard to $\gamma(f)$, when the electricity consumption difference f is the maximum value (f=max(f)), it stands that $\gamma(f)=1$.

Furthermore, by use of the power-source-voltage drop ratio distribution information mentioned above, variation information may be calculated, too. In concrete, variation information may be calculated by following equation (5)

$$V(d) = ocv \times \alpha(d) \times \beta(e) \times \gamma(f) \tag{5}$$

Figure 9:
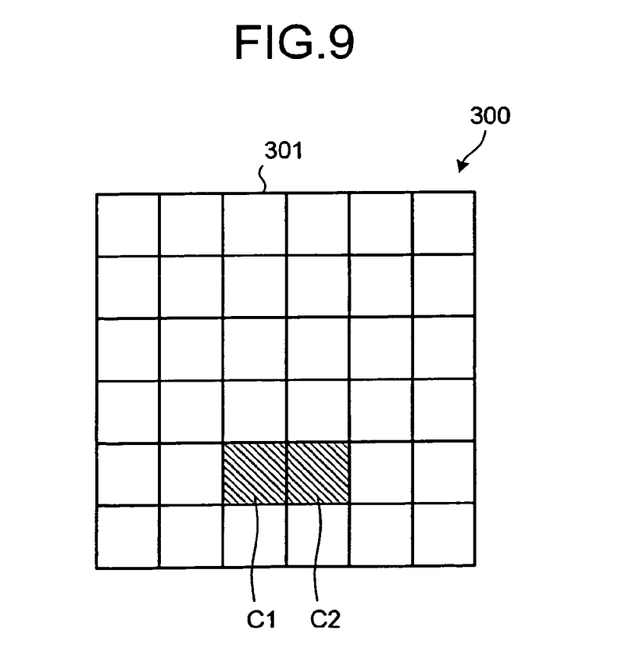
FIG. 9 is an explanatory figure showing layout data divided by a dividing unit.

Meanwhile, in the parameter calculating unit 204 shown in FIG. 3, the area calculation processing unit 220 has a dividing unit 221, a detecting unit 222, and an area calculating unit 223. The dividing unit 221 divides the layout data 300 into plural areas. For example, the dividing unit divides the layout data 300 into plural blocks (6×6 in the figure). FIG. 9 is an explanatory figure showing the layout data 300 divided by the dividing unit 221. In the structure shown in FIG. 9, one block is a square of 1 [mm]×1 [mm].

Furthermore, the detecting unit 222 detects areas that contain the objective circuit data 400, among areas obtained by the division by the dividing unit 221. In concrete, the detecting unit detects two blocks C1 and C2 where this objective circuit data 400 is arranged. The area calculating unit 223 calculates the area of the areas detected by the detecting unit 222. In concrete, the area calculating unit calculates the area of the detected blocks C1 and C2. In the example in FIG. 9, since there are two blocks, when the area of the detected blocks C1 and C2 is defined as g, it stands that g=1 [mm]×2

[mm]=2 [mm²]. In this instance, variation information V(g) may be calculated by following equation (6)

$$V(g) = ocv \times \sigma(g) \quad (6)$$

where σ(g) is a fluctuation function that fluctuates ocv in dependence on the area g of the detected blocks C1 and C2, and is a function with which it stands that 0<σ(g)≦1. For example, in the structure shown in FIG. 9, the number of the detected blocks is two. Therefore, the equation (6) leads to V(1×2)=ocv×σ(1×2).

Furthermore, in this instance, by use of any one of the power-source-voltage drop ratio distribution information and the electricity consumption distribution information or both explained above, variation information may be calculated. In concrete, variation information may be calculated by use of one of following equations (7) to (9)

$$V(g) = ocv \times \sigma(g) \times \beta(e) \quad (7)$$

$$V(g) = ocv \times \sigma(g) \times \gamma(f) \quad (8)$$

$$V(g) = ocv \times \sigma(g) \times \beta(e) \times \gamma(f) \quad (9)$$

With regard to the objective circuit data detecting unit 202, the delay time calculating unit 203, the parameter calculating unit 204, the variation information calculating unit 205, the timing analyzing unit 206, the correcting unit 207, and the distribution information generating unit 208, in concrete, the functions thereof are realized by, for example, the CPU 101 executing programs recorded in the ROM 102, the RAM 103, the HD 105, the FD 107 and so forth, or by the I/F 109.

Figure 10:
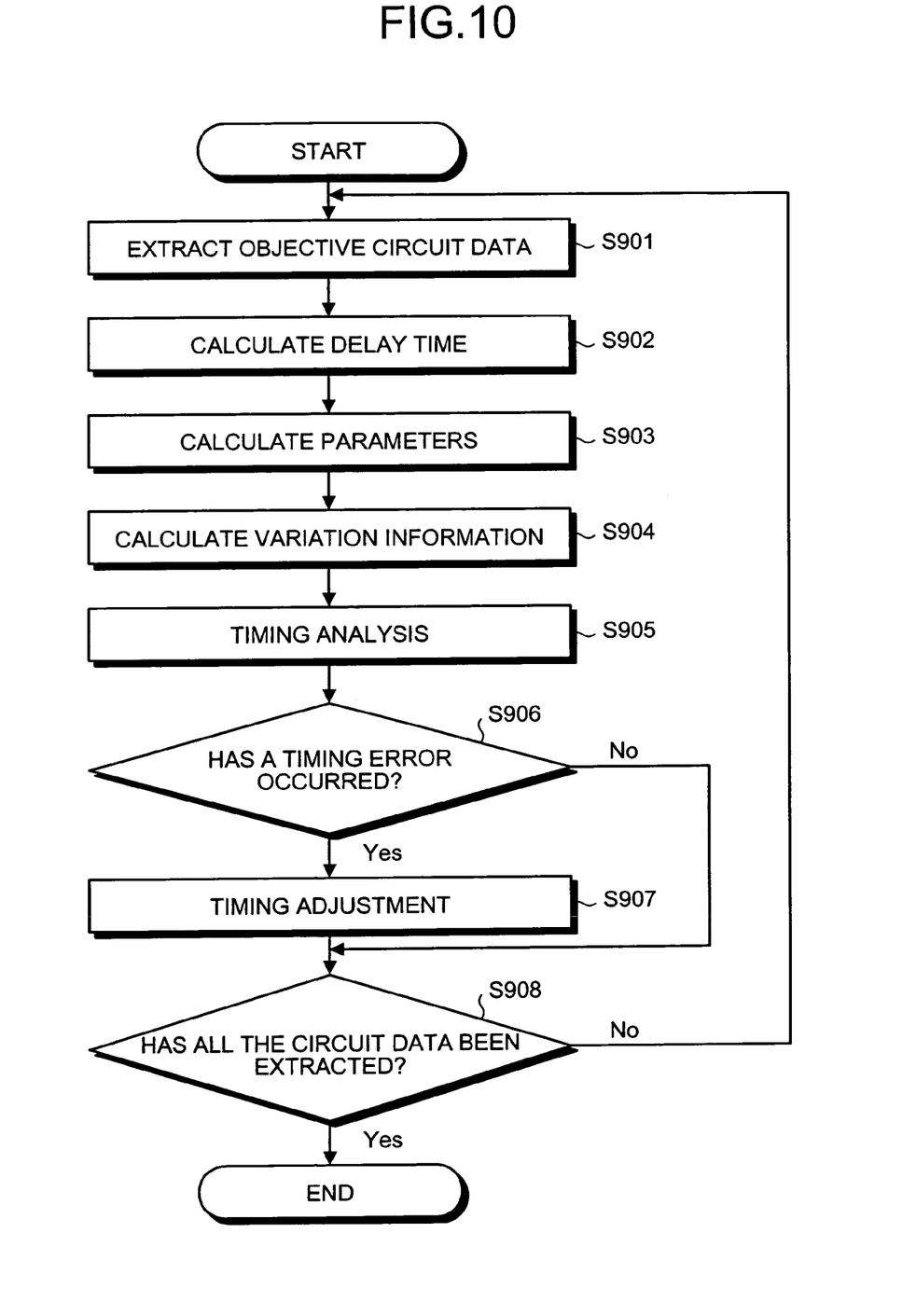
FIG. 10 is a flowchart showing timing analysis processing procedures according to the embodiment.

FIG. 10 is a flowchart showing timing analysis processing procedures according to an embodiment of the present invention.

First, in the structure shown in FIG. 10, the objective circuit data detecting unit 202 extracts the objective circuit data 400 from the layout data 300 (step S901). Then, the delay time calculating unit 203 calculates the delay time of the objective circuit (step S902), and the parameter calculating unit 204 calculates parameters showing the size of the arrangement area of the objective circuit data 400 (step S903). The parameters calculated at this step S903 may be the distance calculated by the distance calculation processing unit 210, or may be the area calculated by the area calculation processing unit 220.

Thereafter, the variation information calculating unit 205, by use of the parameters calculated at the step S903, calculates the variation information V (V(d) or V(g)) of the delay time calculated at the step S902 (step S904). This variation information may be calculated by use of the equations (1), (3) to (9).

Then, by use of the delay time calculated at the step S902, and the variation information calculated at the step S904, timing analysis of the objective circuit is carried out (step S905). If the analysis result analyzed by this timing analysis is not a timing error ('NO' at step S906), the process goes to a step S908.

Meanwhile, if there is a timing error ('YES' at step S906), the correcting unit 207 carries out timing adjustment (step S907). Thereby, it is possible to eliminate a timing error of the objective circuit. Thereafter, if all the circuit data 302 is not extracted ('NO' at step S908), the process goes to the step S901, where new objective circuit data 400 is extracted. Meanwhile, if all the circuit data 302 is extracted ('YES' at step S908), the series of processes is completed.

Thereby, it is possible to change the OCV coefficient that formerly has been uniform in any circuit, into a value to meet an objective circuit, and to give a variation according to the size of the objective circuit to the delay time. Furthermore, with regard to the timing error, it is possible to correct the timing error by changing the distance calculated by the distance calculation processing unit 210, therefore, there is no need to insert new buffers or change wire routes greatly, and further it is possible to simplify the correction work.

Figure 11:
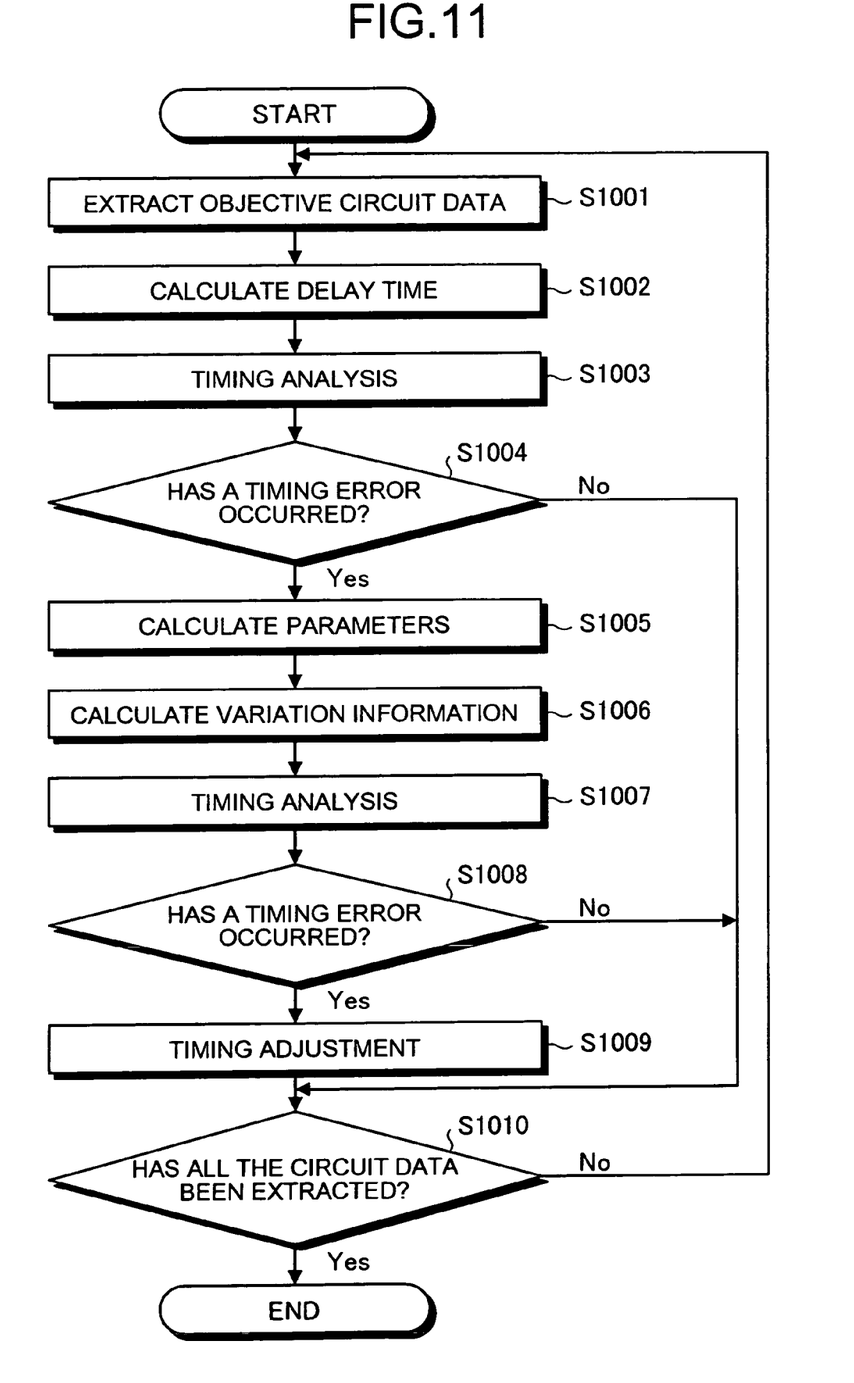
FIG. 11 is a flowchart showing another example of timing analysis processing procedures according to the embodiment.

FIG. 11 is a flowchart showing another example of timing analysis processing procedures according to an embodiment of the present invention. In this flowchart, by reducing the number of circuits to be checked, i.e., objective circuits, TAT is shortened.

Namely, in the structure shown in FIG. 11, first, in the same manners as formerly, the objective circuit data extracting unit 202 extracts the objective circuit data 400 (step S1001), and then the delay time calculating unit 203 calculates the delay time of the objective circuit (step S1002), and the timing analyzing unit 206 carries out timing analysis by use of the calculated delay time and the OCV coefficient (step S1003).

Then, by the timing analysis at the step S1003, if there is not any timing error ('NO' at step S1004), the process goes to a step S1010. Meanwhile, if there is a timing error ('YES' at step S1004), the parameter calculating unit 204 calculates parameters with the objective circuit that has the timing error (step S1005). The parameters calculated at this step S1005 may be the distance calculated by the distance calculation processing unit 210, or may be the area calculated by the area calculation processing unit 220.

Thereafter, the variation information calculating unit 205, by use of the parameters calculated at the step S1005, calculates the variation information V (V(d) or V(g)) of the delay time calculated at the step S1002 (step S1006). This variation information may be calculated by use of the equations (1) and (3) to (9).

Then, by use of the delay time calculated at the step S1002, and the variation information calculated at the step S1006, timing analysis of the objective circuit is carried out (step S1007). Thereby, it is possible to carry out timing analysis that is far more precise than timing analysis at the step S1003. If there is not any timing error by this timing analysis ('NO' at step S1008), the process goes to the step S1010.

Meanwhile, if there is a timing error ('YES' at step S1008), the correcting unit 207 carries out timing adjustment (step S1009). If all the circuit data 302 is not extracted ('NO' at step S1010), the process goes to the step S1001. Meanwhile, if all the circuit data 302 is extracted ('YES' at step S1010), the series of processes is completed.

According to the timing analysis processing procedures, because parameters and variation information are calculated only with the objective circuit data 400 that has a timing error in normal timing analysis, it is possible to reduce the number of the objective circuit data 400. As a consequence, it is possible to reduce the number of calculation processes of parameters and variation information, also to shorten TAT. Furthermore, because timing analysis is carried out once again by use of the calculated variation information, it is possible to increase the precision of timing analysis.

As explained above, in a timing analysis apparatus, a timing analysis method, a timing analysis program, and a recording medium according to the present invention, it is possible to calculate parameters according to objective circuits, and to give variation information to delay time, according to the objective circuits, as a consequence, it is possible to carry out timing analysis in precise consideration of delay time caused by manufacturing processes.

Especially, it is possible to use power-source-voltage drop ratios and electricity consumption differences at arrangement positions of objective circuits, from distribution information of power-source-voltage drop ratios and electricity consumption, also to give variation information in consideration of variations of OCV coefficient, to delay time.

Furthermore, when parameters are set to the distance between buffers, it is possible to calculate a distance between buffers where a timing error does not occur, from timing error information, as a consequence, it is possible to simplify layout correction, and also to shorten TAT.

The timing analysis method explained in the embodiment of the present invention may be realized by executing a preset program by a computer such as a personal computer, a work station, or a CAD. This program is recorded into a recording medium that may be read by a computer such as a hard disk, a flexible disk, a CD-ROM, a MO, a DVD, and read out from such a recording medium and executed by the computer. Furthermore, this program may be a transmission medium that may be distributed via a network such as internet.

According to a timing analysis apparatus, a timing analysis method, a timing analysis program and a recording medium according to the present invention, an advantageous effect to shorten TAT via efficient and highly precise timing analysis may be attained.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A timing analysis apparatus, comprising:
   a data extracting unit that extracts objective circuit data concerning an objective circuit to become an objective of a timing analysis and including a plurality of circuit element data from layout data indicating circuits arranged and wired on a large-scale-integration chip;
   a time calculating unit that calculates a delay time of the objective circuit based on the objective circuit data extracted;
   a parameter calculating unit that calculates a parameter indicating a size of an arrangement area of the objective circuit based on the objective circuit data extracted, using a maximum distance between two arbitrary circuit elements extracted from the circuit element data;
   an information calculating unit that calculates, based on the parameter, variation information concerning a variation of the delay time calculated; and
   a timing analyzing unit that performs the timing analysis of the objective circuit using the delay time and the variation information calculated wherein the parameter calculating unit includes
   a combination extracting unit that extracts a combination of two arbitrary circuit element data from the circuit element data;
   a distance calculating unit that calculates a distance between the two arbitrary circuit element data in the combination extracted; and
   a distance extracting unit that determines the maximum distance from distances calculated by the distance calculating unit for a plurality of combinations extracted by the combination extracting unit from the circuit element data.

2. The timing analysis apparatus according to claim 1, wherein the parameter calculating unit calculates an area occupied by the objective circuit on the large-scale-integration chip, and takes the area calculated as the parameter.

3. The timing analysis apparatus according to claim 1, further comprising:
   an information generating unit that generates distribution information indicating a distribution of a power-source-voltage drop ratio of the large-scale-integration chip based on the layout data,
   wherein the information calculating unit calculates the variation information based on the distribution information generated.

4. The timing analysis apparatus according to claim 1, further comprising:
   an information generating unit that generates distribution information indicating a distribution of an electric power consumption on the large-scale-integration chip based on the layout data,
   wherein the information calculating unit calculates the variation information based on the distribution information generated.

5. The timing analysis apparatus according to claim 1, further comprising a correcting unit that calculates, when the timing analyzing unit detects a timing error, a new parameter that enables to eliminate the timing error, based on information concerning the timing error and the delay time calculated, and corrects an arrangement of the circuit element data using the new parameter calculated.

6. A timing analysis apparatus, comprising:
   a data extracting unit that extracts objective circuit data concerning an objective circuit to become an objective of a timing analysis and including a plurality of circuit element data from layout data indicating circuits arranged and wired on a large-scale-integration chip;
   a time calculating unit that calculates a delay time of the objective circuit based on the objective circuit data extracted;
   a timing analyzing unit that performs the timing analysis of the objective circuit using the delay time calculated;
   a parameter calculating unit that calculates a parameter indicating a size of an arrangement area of the objective circuit that is determined to have a timing error as a result of the timing analysis, using a maximum distance between two arbitrary circuit elements extracted from the circuit element data; and
   an information calculating unit that calculates, based on the parameter, variation information concerning a variation of the delay time calculated, wherein
   the timing analyzing unit performs the timing analysis of the objective circuit that is determined to have the timing error based on the delay time and the variation information calculated, and
   the parameter calculating unit includes
   a combination extracting unit that extracts a combination of two arbitrary circuit element data from the circuit element data;
   a distance calculating unit that calculates a distance between the two arbitrary circuit element data in the combination extracted; and
   a distance extracting unit that determines the maximum distance from distances calculated by the distance calculating unit for a plurality of combinations extracted by the combination extracting unit from the circuit element data.

7. A timing analysis method, comprising:
   extracting objective circuit data concerning an objective circuit to become an objective of a timing analysis and including a plurality of circuit element data from layout data indicating circuits arranged and wired on a large-scale-integration chip;
   calculating a delay time of the objective circuit based on the objective circuit data extracted;

calculating a parameter indicating a size of an arrangement area of the objective circuit based on the objective circuit data extracted, using a maximum distance between two arbitrary circuit elements extracted from the circuit element data;

calculating variation information concerning a variation of the delay time calculated; and performing the timing analysis of the objective circuit using the delay time and the variation information calculated, wherein calculating the parameter includes extracting a combination of two arbitrary circuit element data from the objective circuit data;

calculating a distance between the two arbitrary circuit element data in the combination; and determining the maximum distance from calculated distances for a plurality of combinations.

8. The timing analysis method according to claim 7, wherein the calculating of the parameter includes calculating an area occupied by the objective circuit on the large-scale-integration chip to take the area calculated as the parameter.

9. The timing analysis method according to claim 7, further comprising:

generating distribution information indicating a distribution of a power-source-voltage drop ratio of the large-scale-integration chip based on the layout data, wherein the calculating of the variation information includes calculating the variation information based on the distribution information generated.

10. The timing analysis method according to claim 7, further comprising:

generating distribution information indicating a distribution of an electric power consumption on the large-scale-integration chip based on the layout data, wherein the calculating of the variation information includes calculating the variation information based on the distribution information generated.

11. The timing analysis method according to claim 7, wherein the calculating of the parameter further includes:

calculating, when a timing error is detected at the performing, a new parameter that enables to eliminate the timing error, based on information concerning the timing error and the delay time calculated; and correcting an arrangement of the circuit element data using the new parameter calculated.

12. A timing analysis method, comprising:

extracting objective circuit data concerning an objective circuit to become an objective of a timing analysis and including a plurality of circuit element data from layout data indicating circuits arranged and wired on a large-scale-integration chip;

calculating a delay time of the objective circuit based on the objective circuit data extracted;

performing the timing analysis of the objective circuit using the delay time calculated;

calculating a parameter indicating a size of an arrangement area of the objective circuit that is determined to have a timing error as a result of the timing analysis, using a maximum distance between two arbitrary circuit elements extracted from the circuit element data; and calculating variation information concerning a variation of the delay time calculated, wherein the performing includes performing the timing analysis of the objective circuit that is determined to have the timing error based on the delay time and the variation information calculated, and the calculating of the parameter includes extracting a combination of two arbitrary circuit element data from the objective circuit data;

calculating a distance between the two arbitrary circuit element data in the combination; and determining the maximum distance from calculated distances for a plurality of combinations.

13. A timing analysis program making a computer execute:

extracting objective circuit data concerning an objective circuit to become an objective of a timing analysis and including a plurality of circuit element data from layout data indicating circuits arranged and wired on a large-scale-integration chip;

calculating a delay time of the objective circuit based on the objective circuit data extracted;

calculating a parameter indicating a size of an arrangement area of the objective circuit based on the objective circuit data extracted, using a maximum distance between two arbitrary circuit elements extracted from the circuit element data;

calculating variation information concerning a variation of the delay time calculated; and performing the timing analysis of the objective circuit using the delay time and the variation information calculated, wherein the calculating of the parameter includes extracting a combination of two arbitrary circuit element data from the circuit element data;

calculating a distance between the two arbitrary circuit element data in the combination extracted; and determining the maximum distance between two arbitrary circuit elements from distances calculated for a plurality of combinations extracted from the circuit element data.

14. The timing analysis program according to claim 13, wherein the calculating of the parameter includes calculating an area occupied by the objective circuit on the large-scale-integration chip to take the area calculated as the parameter.

15. The timing analysis program according to claim 13, further making the computer execute:

generating distribution information indicating a distribution of a power-source-voltage drop ratio of the large-scale-integration chip based on the layout data, wherein the calculating of the variation information includes calculating the variation information based on the distribution information generated.

16. The timing analysis program according to claim 13, further making the computer execute:

generating distribution information indicating a distribution of an electric power consumption on the large-scale-integration chip based on the layout data, wherein the calculating of the variation information includes calculating the variation information based on the distribution information generated.

17. The timing analysis program according to claim 13, wherein the calculating of the parameter further includes:

calculating, when a timing error is detected at the performing, a new parameter that enables to eliminate the timing error, based on information concerning the timing error and the delay time calculated; and correcting an arrangement of the circuit element data using the new parameter calculated.

18. A timing analysis program making a computer execute:

extracting objective circuit data concerning an objective circuit to become an objective of a timing analysis and including a plurality of circuit element data from layout data indicating circuits arranged and wired on a large-scale-integration chip;

calculating a delay time of the objective circuit based on the objective circuit data extracted;

performing the timing analysis of the objective circuit using the delay time calculated;

calculating a parameter indicating a size of an arrangement area of the objective circuit that is determined to have a timing error as a result of the timing analysis, using a maximum distance between two arbitrary circuit elements extracted from the circuit element data; and calculating variation information concerning a variation of the delay time calculated, wherein the performing includes performing the timing analysis of the objective circuit that is determined to have the timing error based on the delay time and the variation information calculated wherein the calculating of the parameter includes     extracting a combination of two arbitrary circuit element data from the circuit element data;

calculating a distance between the two arbitrary circuit element data in the combination extracted; and     determining the maximum distance between two arbitrary circuit elements from distances calculated for a plurality of combinations extracted from the circuit element data.

19. A computer-readable recording medium storing a timing analysis program, which the timing analysis program when executing on a computer makes the computer execute:

extracting objective circuit data concerning an objective circuit to become an objective of a timing analysis and including a plurality of circuit element data from layout data indicating circuits arranged and wired on a large-scale-integration chip;

calculating a delay time of the objective circuit based on the objective circuit data extracted;

calculating a parameter indicating a size of an arrangement area of the objective circuit based on the objective circuit data extracted, using a maximum distance between two arbitrary circuit elements extracted from the circuit element data;

calculating variation information concerning a variation of the delay time calculated; and performing the timing analysis of the objective circuit using the delay time and the variation information calculated wherein the calculating of the parameter includes     extracting a combination of two arbitrary circuit element data from the circuit element data;

calculating a distance between the two arbitrary circuit element data in the combination extracted; and     determining the maximum distance between two arbitrary circuit elements from distances calculated for a plurality of combinations extracted from the circuit element data.

20. A computer-readable recording medium storing a timing analysis program, which the timing analysis program when executed on a computer makes the computer execute:

extracting objective circuit data concerning an objective circuit to become an objective of a timing analysis and including a plurality of circuit element data from layout data indicating circuits arranged and wired on a large-scale-integration chip;

calculating a delay time of the objective circuit based on the objective circuit data extracted;

performing the timing analysis of the objective circuit using the delay time calculated, using a maximum distance between two arbitrary circuit elements extracted from the circuit element data;

calculating a parameter indicating a size of an arrangement area of the objective circuit that is determined to have a timing error as a result of the timing analysis; and calculating variation information concerning a variation of the delay time calculated, wherein the performing includes performing the timing analysis of the objective circuit that is determined to have the timing error based on the delay time and the variation information calculated wherein the calculating of the parameter includes     extracting a combination of two arbitrary circuit element data from the circuit element data,     calculating a distance between the two arbitrary circuit element data in the combination extracted, and     determining the maximum distance between two arbitrary circuit elements from distances calculated for a plurality of combinations extracted from the circuit element data.

21. A timing analysis apparatus, comprising:

a data extracting unit that extracts objective circuit data concerning an objective circuit to become an objective of a timing analysis from layout data indicating circuits arranged and wired on a large-scale-integration chip;

a time calculating unit that calculates a delay time of the objective circuit based on the objective circuit data extracted;

a parameter calculating unit that calculates a parameter indicating a size of an arrangement area of the objective circuit based on the objective circuit data extracted;

an information calculating unit that calculates variation information concerning a variation of the delay time calculated;

a timing analyzing unit that performs the timing analysis of the objective circuit using the delay time and the variation information calculated;

a correcting unit that calculates, when the timing analyzing unit detects a timing error, a new parameter that enables to eliminate the timing error, based on information concerning the timing error and the delay time calculated, and corrects an arrangement of the circuit element data using the new parameter calculated.

22. A timing analysis method, comprising:

extracting objective circuit data concerning an objective circuit to become an objective of a timing analysis from layout data indicating circuits arranged and wired on a large-scale-integration chip;

calculating a delay time of the objective circuit based on the objective circuit data extracted;

calculating a parameter indicating a size of an arrangement area of the objective circuit based on the objective circuit data extracted, including     calculating, when a timing error is detected at the performing, a new parameter that enables to eliminate the timing error, based on information concerning the timing error and the delay time calculated, and     correcting an arrangement of the circuit element data using the new parameter calculated;

calculating variation information concerning a variation of the delay time calculated; and performing the timing analysis of the objective circuit using the delay time and the variation information calculated.

* * * * *